(12) United States Patent
Kuroyanagi et al.

(10) Patent No.: US 10,270,414 B2
(45) Date of Patent: Apr. 23, 2019

(54) ACOUSTIC WAVE DEVICE

(71) Applicant: TAIYO YUDEN CO., LTD., Tokyo (JP)

(72) Inventors: Takuma Kuroyanagi, Tokyo (JP); Kaoru Sakinada, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 255 days.

(21) Appl. No.: 14/799,322

(22) Filed: Jul. 14, 2015

(65) Prior Publication Data

US 2016/0049919 A1    Feb. 18, 2016

(30) Foreign Application Priority Data

Aug. 13, 2014    (JP) .................... 2014-164662

(51) Int. Cl.
*H03H 9/02* (2006.01)
*H03H 3/08* (2006.01)
*H03H 9/64* (2006.01)

(52) U.S. Cl.
CPC .......... *H03H 3/08* (2013.01); *H03H 9/02866* (2013.01); *H03H 9/02992* (2013.01); *H03H 9/6483* (2013.01)

(58) Field of Classification Search
CPC ........... H03H 9/02535; H03H 9/02614; H03H 9/02629
USPC ...... 310/313 R, 313 A, 313 B, 313 C, 313 D
See application file for complete search history.

(56) References Cited

U.S. PATENT DOCUMENTS

| 6,184,609 | B1 | 2/2001 | Johansson et al. |
| 2002/0149295 | A1* | 10/2002 | Onishi ................. H03H 9/0222 310/313 R |
| 2003/0071539 | A1 | 4/2003 | Kuratani et al. |

(Continued)

FOREIGN PATENT DOCUMENTS

| CN | 102694526 A | 9/2012 |
| CN | 202998019 U | 6/2013 |

(Continued)

OTHER PUBLICATIONS

Chinese Office Action dated Aug. 23, 2017, in a counterpart Chinese patent application No. 201510452233.X.

(Continued)

*Primary Examiner* — Derek J Rosenau
(74) *Attorney, Agent, or Firm* — Chen Yoshimura LLP

(57) ABSTRACT

An acoustic wave device includes: a support substrate; a piezoelectric substrate that is jointed on the support substrate; a plurality of acoustic wave elements that are provided on the piezoelectric substrate; and an interconnection line that is provided on the piezoelectric substrate and couples the plurality of acoustic wave elements, wherein: the piezoelectric substrate of a first area, on which the plurality of acoustic wave elements are provided, is remained; the piezoelectric substrate of a second area, on which the interconnection line is provided, is remained; the piezoelectric substrate of a third area is for cutting the support substrate; and the piezoelectric substrates of a fourth area is other than the first area, the second area and the third area, the fourth area having a fifth area in which at least a part of the piezoelectric substrate is removed.

14 Claims, 12 Drawing Sheets

(56) References Cited

U.S. PATENT DOCUMENTS

| | | | |
|---|---|---|---|
| 2004/0027213 A1* | 2/2004 | Takata | H03H 9/1071 333/133 |
| 2004/0222717 A1 | 11/2004 | Matsuda et al. | |
| 2007/0052324 A1* | 3/2007 | Chen | H03H 3/08 310/313 R |
| 2012/0241211 A1 | 9/2012 | Inoue et al. | |
| 2013/0271238 A1 | 10/2013 | Onda et al. | |

FOREIGN PATENT DOCUMENTS

| | | |
|---|---|---|
| CN | 103378817 A | 10/2013 |
| JP | 2001-60846 A | 3/2001 |
| JP | 2001-217679 A | 8/2001 |
| JP | 2003-087073 A | 3/2003 |
| JP | 2004-336503 A | 11/2004 |
| JP | 2013-021387 A | 1/2013 |
| WO | 2005/050836 A1 | 6/2005 |

OTHER PUBLICATIONS

Japanese Office Action dated Dec. 5, 2017, in a counterpart Japanese patent application No. 2014-164662. (A machine translation (not reviewed for accuracy) attached.).

* cited by examiner

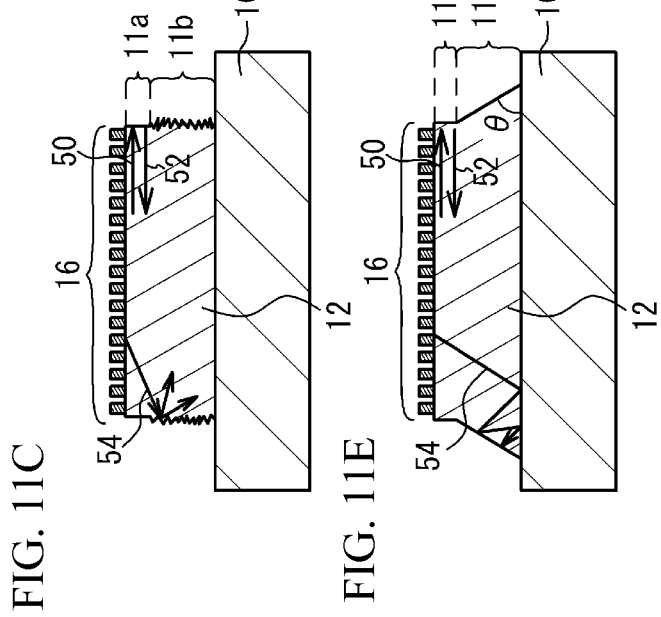
FIG. 11A
FIG. 11B
FIG. 11C
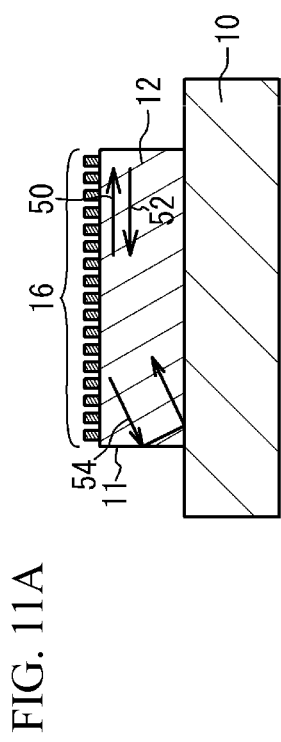
FIG. 11D
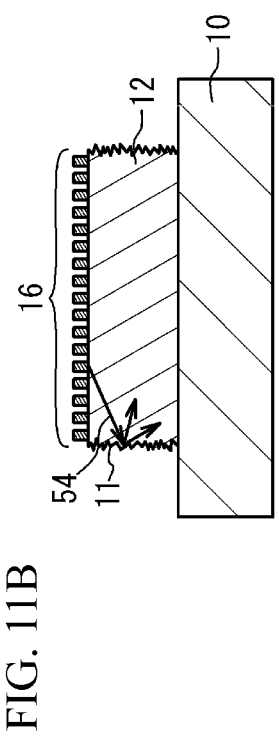
FIG. 11E

ACOUSTIC WAVE DEVICE

CROSS-REFERENCE TO RELATED APPLICATION

This application is based upon and claims the benefit of priority of the prior Japanese Patent Application No. 2014-164662, filed on Aug. 13, 2014, the entire contents of which are incorporated herein by reference.

FIELD

A certain aspect of the present invention relates to an acoustic wave device.

BACKGROUND

There is known an acoustic wave device using an acoustic wave, in which a piezoelectric substrate is adhered to a support substrate and an acoustic wave element is formed on the piezoelectric substrate. When a linear thermal expansion coefficient of the support substrate is smaller than that of the piezoelectric substrate, temperature characteristics of the acoustic wave device can be improved. There is known a technology in which a level difference is formed on a peripheral portion of a lamination substrate in which a support substrate and a piezoelectric substrate are laminated (see, Japanese Patent Application Publication No. 2001-60846).

SUMMARY OF THE INVENTION

According to an aspect of the present invention, there is provided an acoustic wave device including: a support substrate; a piezoelectric substrate that is jointed on the support substrate; a plurality of acoustic wave elements that are provided on the piezoelectric substrate; and an interconnection line that is provided on the piezoelectric substrate and couples the plurality of acoustic wave elements, wherein: the piezoelectric substrate of a first area, on which the plurality of acoustic wave elements are provided, is remained; the piezoelectric substrate of a second area, on which the interconnection line is provided, is remained; the piezoelectric substrate of a third area is for cutting the support substrate; and the piezoelectric substrates of a fourth area is other than the first area, the second area and the third area, the fourth area having a fifth area in which at least a part of the piezoelectric substrate is removed.

BRIEF DESCRIPTION OF THE DRAWINGS

FIG. 11A illustrates a cross sectional view of a first embodiment;
FIG. 11B to FIG. 11E illustrate cross sectional views of a third embodiment and a modification of the third embodiment.

DETAILED DESCRIPTION

In the Document 1, it is not considered that a plurality of acoustic wave elements formed on the piezoelectric substrate are connected by an interconnection line.

A description will be given of embodiments with reference to drawings.

First Embodiment

Figure 1A:
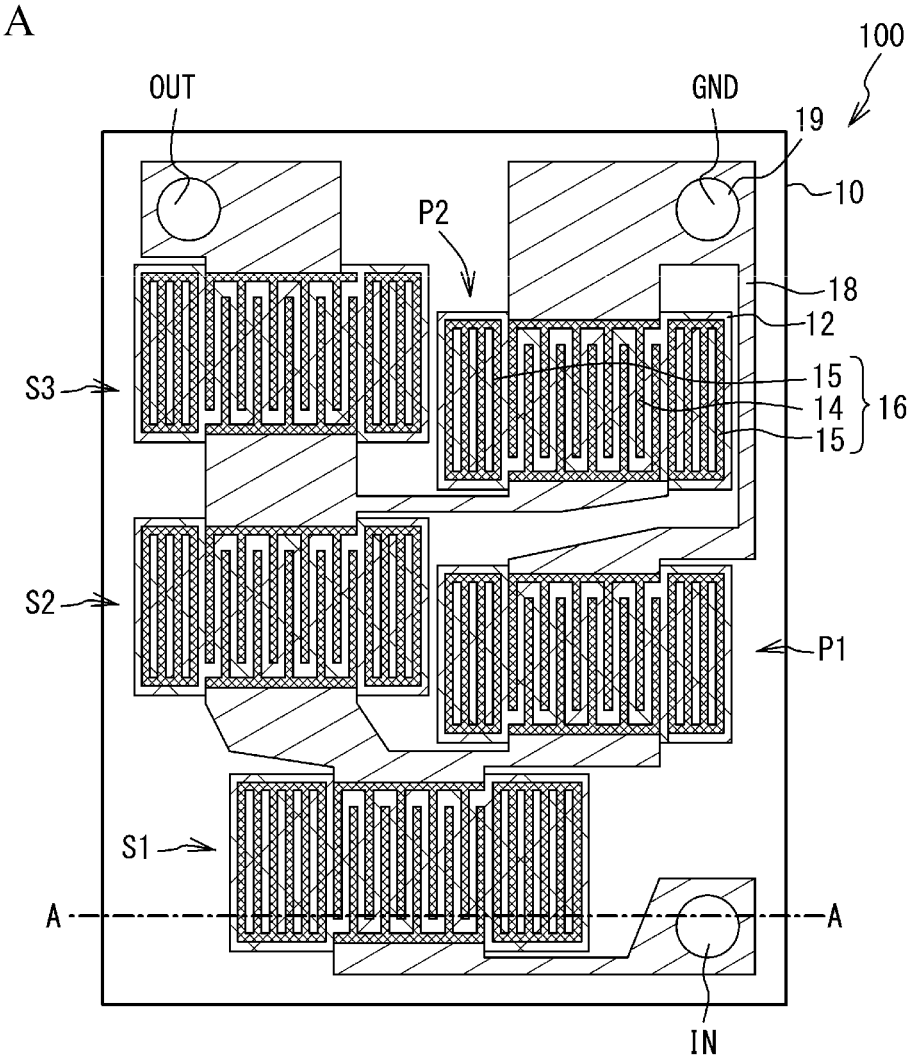
FIG. 1A illustrates a plane view of an acoustic wave device in accordance with a first embodiment.
Figure 1B:
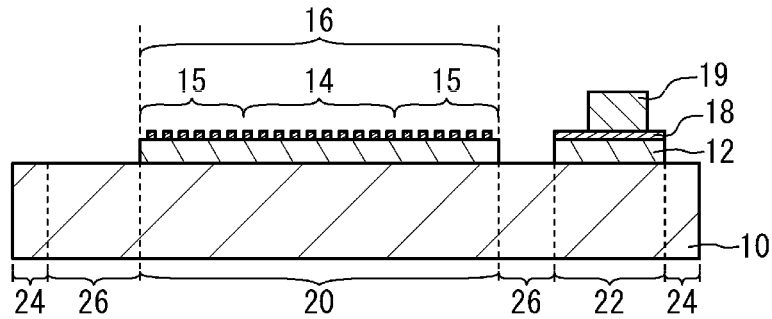
FIG. 1B illustrates a cross sectional view taken along a line A-A of FIG. 1A.

FIG. 1A illustrates a plane view of an acoustic wave device in accordance with a first embodiment. FIG. 1B illustrates a cross sectional view taken along a line A-A of FIG. 1A. As illustrated in FIG. 1A and FIG. 1B, in an acoustic wave device 100, a piezoelectric substrate 12 is jointed on a support substrate 10. The support substrate 10 is, for example, a sapphire substrate. The piezoelectric substrate 12 is, for example, a lithium tantalate substrate.

On the piezoelectric substrate 12, IDTs (Interdigital Transducers) 14, reflectors 15 and interconnection lines 18 are formed. The IDT 14 excites an acoustic wave in or on a surface of the piezoelectric substrate 12. The reflector 15 reflects the acoustic wave. The IDT 14 and the reflector 15 form an acoustic wave element 16 such as a resonator. The interconnection line 18 electrically couples the acoustic wave elements 16 and/or the acoustic wave element 16 and a terminal 19. The IDT 14 and the reflector 15 are, for example, a metal film such as an aluminum film. The interconnection line 18 is a lamination film in which metal films such as an aluminum film, a titanium film and a gold film are laminated from underneath. On the interconnection line 18, the terminal 19 to be electrically connected to an outer component is formed. The terminal 19 is, for example, a bump such as a solder or gold.

As illustrated in FIG. 1A, series resonators S1 to S3 and parallel resonators P1 and P2 are formed on the support substrate 10 as a plurality of the acoustic wave elements 16. One or more series resonators S1 to S3 are connected in series via the interconnection line 18 between an input terminal IN and an output terminal OUT. One or more parallel resonators P1 and P2 are connected in parallel via the interconnection line 18 between the input terminal IN and the output terminal OUT. The parallel resonators P1 and P2 are electrically connected to a ground terminal GND via the interconnection line 18.

The support substrate 10 has an area 20 (first area) on which a plurality of the acoustic wave elements 16 are formed, an area 22 (second area) on which the interconnection lines 18 are formed, an area 24 (third area: dicing line) for cutting the support substrate 10 and an area 26 (fourth area) other than the areas 20, 22 and 24. In order to secure a manufacturing error and a manufacturing margin, the area 20 may be an area having a width larger than the acoustic wave elements 16 by a few μm to 10 μm. The areas 22 and 24 may have the same structure. The areas 20 and 22 of the piezoelectric substrate 12 are remained. The areas 24 and 26 of the piezoelectric substrate 12 are removed such that the support substrate 10 is exposed.

Figure 2A:
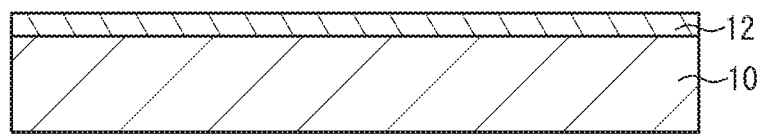
FIG. 2A to FIG. 2D illustrate cross sectional views for describing a manufacturing method of an acoustic wave device in accordance with a first embodiment.

FIG. 2A to FIG. 3C illustrate cross sectional views for describing a manufacturing method of the acoustic wave device in accordance with the first embodiment. As illustrated in FIG. 2A, the piezoelectric substrate 12 is jointed to an upper face of the support substrate 10. For example, the piezoelectric substrate 12 is jointed to the support substrate 10 by a jointing method at a normal temperature activating surfaces thereof. The support substrate 10 may be a sapphire substrate, a silicon substrate, an aluminum oxide substrate or the like. The piezoelectric substrate 12 may be a lithium tantalate substrate, a lithium niobate substrate or the like. A film thickness of the support substrate 10 is, for example, 50 μm to 150 μm. A film thickness of the piezoelectric substrate 12 is, for example, 5 μm to 50 μm.

Figure 2B:
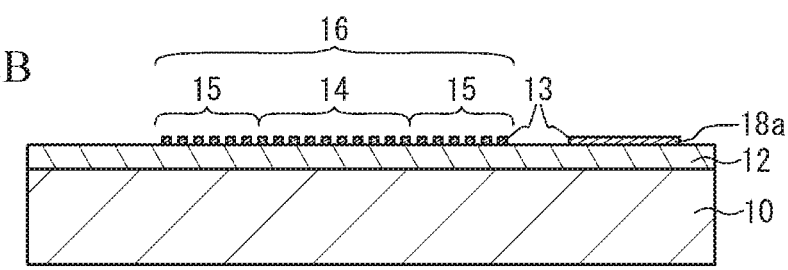

As illustrated in FIG. 2B, the IDT 14, the reflectors 15, and a lower layer 18a of the interconnection line 18 that are made of a metal film 13 are formed on the piezoelectric substrate 12. The metal film 13 is, for example, an aluminum film in which copper is doped. The metal film 13 may be a copper film or the like. The metal film 13 may be formed by a sputtering method, a vapor deposition method or the like. A pattern may be formed by an etching method or a lift off method.

Figure 2C:
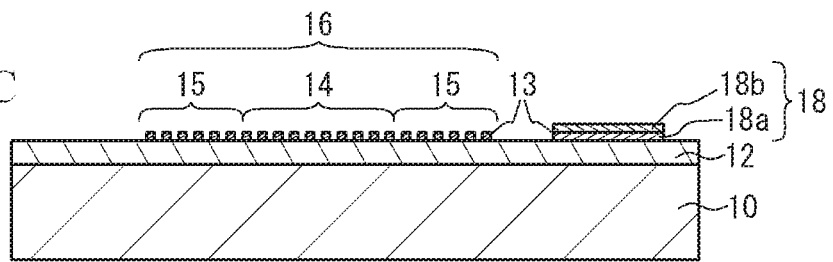

As illustrated in FIG. 2C, an upper layer 18b is formed on the lower layer 18a. The upper layer 18b is, for example, a lamination layer of a titanium layer and a gold layer from the lower layer 18a side. A film thickness and a material of the metal film 13 are selected in accordance with characteristics of the acoustic wave element 16. The upper layer 18b acts as a conductive layer and includes a layer having a resistivity lower than that of the lower layer 18a. The metal film 13 and the interconnection lines 18 may be formed together with each other, and the metal film 13 and the interconnection films 18 may be an identical film, without the upper layer 18b. The metal film 13 of the acoustic wave element 16 and the interconnection lines 18 may be formed separately from each other and may be made of a different material. In the following, the lower layer 18a and the upper layer 18b are illustrated as the interconnection lines 18. And, the lower layer 18a and the upper layer 18b are not illustrated.

Figure 2D:
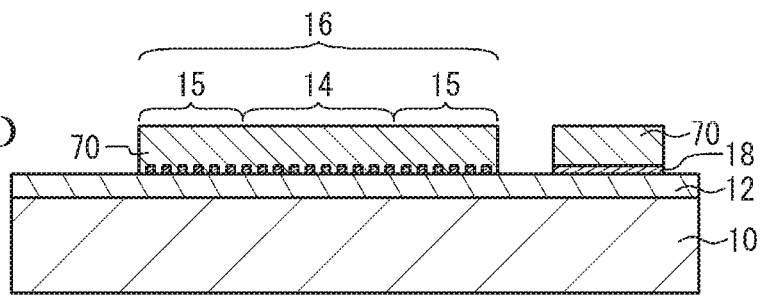

As illustrated in FIG. 2D, a mask layer 70 is formed on the piezoelectric substrate 12. The mask layer 70 is, for example, a photo resist. The mask layer 70 on the acoustic wave elements 16 and the interconnection lines 18 are remained. Other area of the mask layer 70 is an aperture.

Figure 3A:
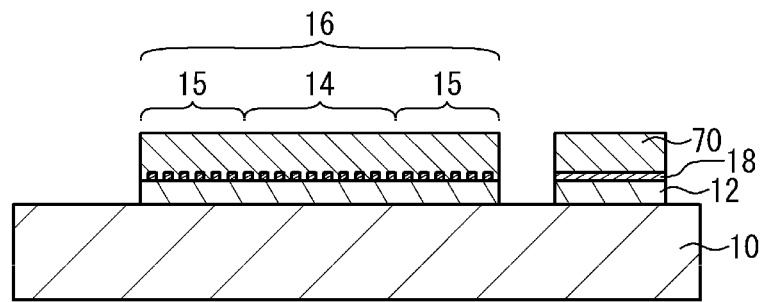
FIG. 3A to FIG. 3C illustrate cross sectional views for describing a manufacturing method of an acoustic wave device in accordance with a first embodiment.

As illustrated in FIG. 3A, a part of the piezoelectric substrate 12 is removed with use of the mask layer 70 as a mask. The part of the piezoelectric substrate 12 is removed by an etching method of a blast method. Thus, the part of the piezoelectric substrate 12 other than the acoustic wave elements 16 and the interconnection lines 18 is removed, and the support substrate 10 is exposed.

Figure 3B:
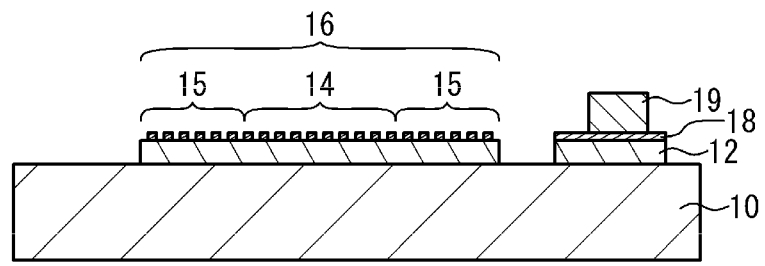
Figure 3C:
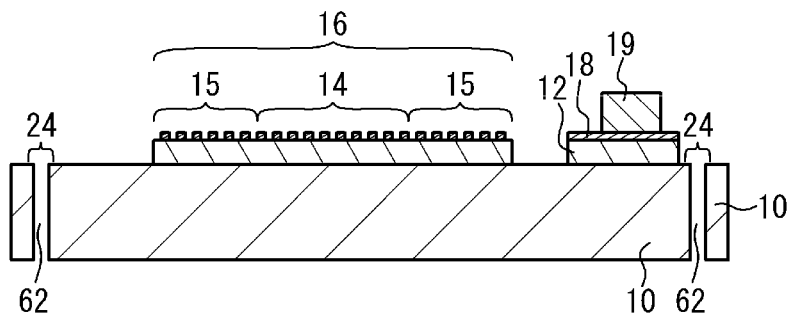

As illustrated in FIG. 3B, the mask layer 70 is removed. The terminal 19 is formed on the interconnection line 18. The terminal 19 may be a solder bump, a gold stud bump or the like. As illustrated in FIG. 3C, a laser light is radiated to the area 24. The support substrate 10 is cut as illustrated with an area 62 by braking. With the processes, the acoustic wave device in accordance with the first embodiment can be manufactured.

Figure 4A:
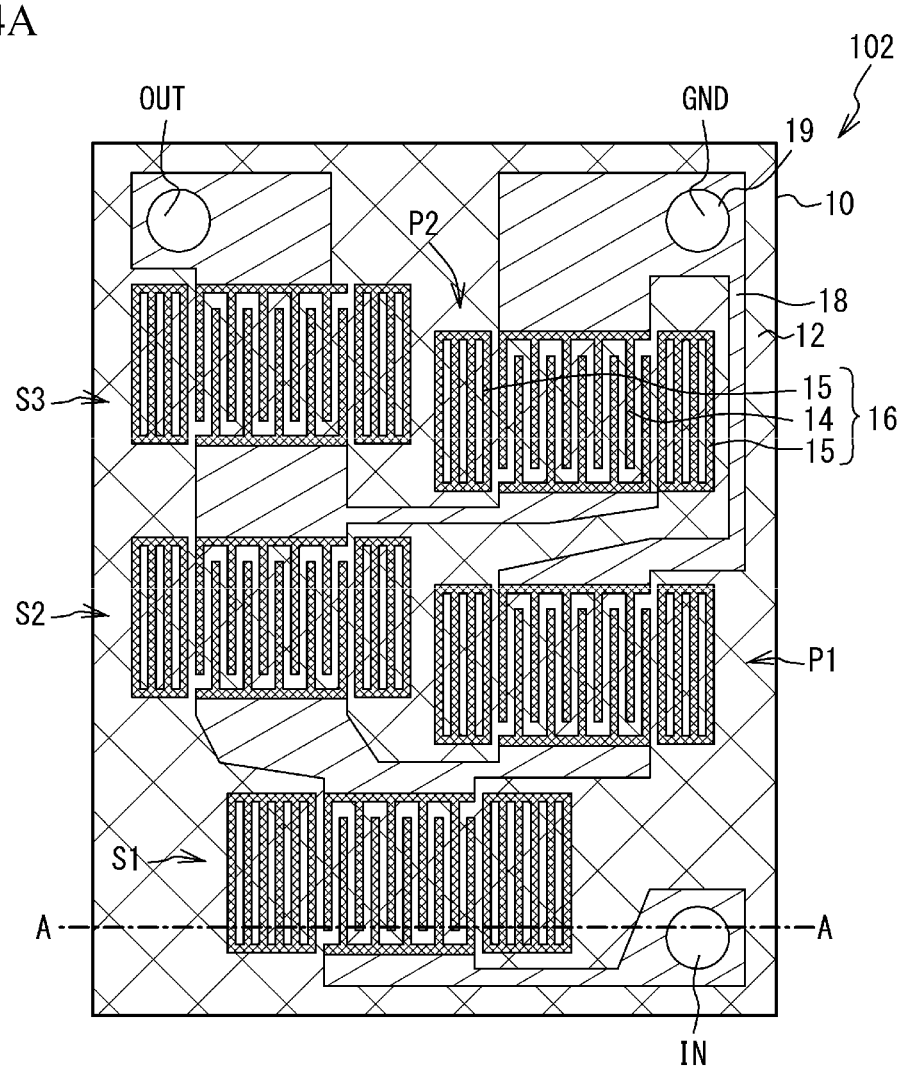
FIG. 4A illustrates a plane view of an acoustic wave device in accordance with a first comparative example.
Figure 4B:
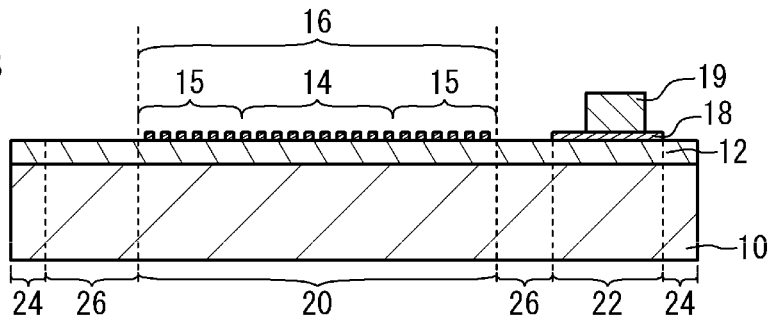
FIG. 4B illustrates a cross sectional view taken along a line A-A of FIG. 4A.

FIG. 4A illustrates a plane view of an acoustic wave device in accordance with a first comparative example. FIG. 4B illustrates a cross sectional view taken along a line A-A of FIG. 4A. As illustrated in FIG. 4A and FIG. 4B, in an acoustic wave device 102, the piezoelectric substrate 12 is not removed. That is, the piezoelectric substrate 12 of the areas 20, 22, 24 and 26 is remained. Other structures are the same as the first embodiment. Therefore, an explanation of the structures is omitted.

In the first embodiment and the first comparative example, the piezoelectric substrate 12 is jointed on the support substrate 10 having a linear thermal expansion coefficient smaller than that of the piezoelectric substrate 12. Thus, the temperature characteristics of the acoustic wave elements 16 can be controlled. In this manner, the characteristics of the acoustic wave elements 16 can be controlled by jointing the piezoelectric substrate 12 on the support substrate 10.

Figure 5A:
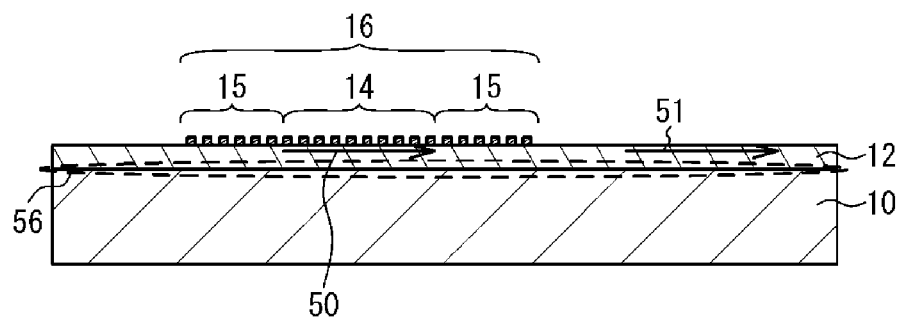
FIG. 5A illustrates a cross sectional view of a first comparative example.
Figure 5B:
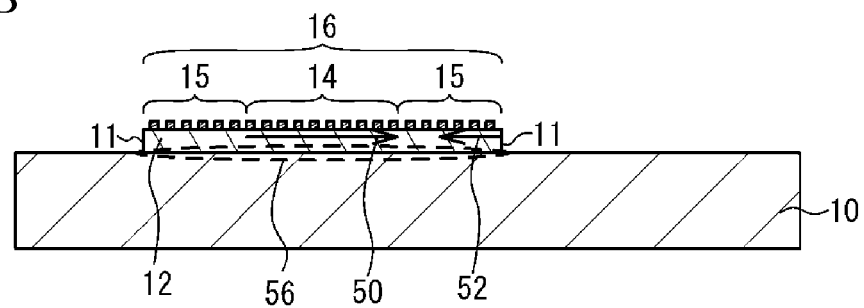
FIG. 5B illustrates a cross sectional view of a first embodiment.

FIG. 5A illustrates a cross sectional view of the first comparative example. FIG. 5B illustrates a cross sectional view of the first embodiment. As illustrated in FIG. 5A, in the first comparative example, a surface acoustic wave 50 (an acoustic wave) excited by the IDT 14 is reflected by the reflectors 15. However, an acoustic wave 51 that is a part of the surface acoustic wave 50 is leaked from the reflectors 15 and propagates in the piezoelectric substrate 12. Thus, a loss of the acoustic wave element 16 becomes larger. As illustrated in FIG. 5B, in the first embodiment, the piezoelectric substrate 12 outside of the acoustic wave element 16 is removed. Thus, the surface acoustic wave 50 is reflected by a facet 11 of the piezoelectric substrate 12 and becomes a surface acoustic wave 52. It is therefore possible to suppress the loss of the acoustic wave element 16.

In the first comparative example, stress is accumulated at an interface 56 between the support substrate 10 and the piezoelectric substrate 12. Thus, cracking and/or distortion may occur in the piezoelectric substrate 12. On the other hand, in the first embodiment, the stress accumulated at the interface 56 between the support substrate 10 and the piezoelectric substrate 12 is small because an area of the interface 56 is small. It is therefore suppress the cracking and/or the distortion of the piezoelectric substrate 12.

Moreover, the piezoelectric substrate 12 is made of a pyroelectric material. When stress or heat is applied to the piezoelectric substrate 12, an electrical charge may occur. When the area of the piezoelectric substrate 12 is large as in the case of the first comparative example, an amount of the electrical charge becomes larger. Thus, the acoustic wave elements 16 may be damaged. In the first embodiment, the area of the piezoelectric substrate 12 can be reduced. Therefore, the amount of the electrical charge is small. And, it is possible to suppress the damage or the like of the acoustic wave elements 16.

Figure 6A:
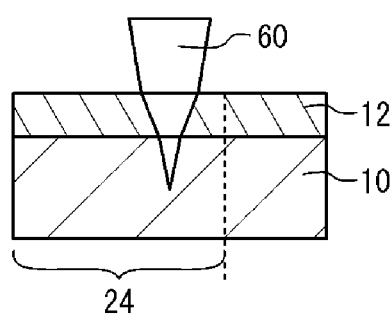
FIG. 6A and FIG. 6B illustrate cross sectional views of a first comparative example.
Figure 6B:
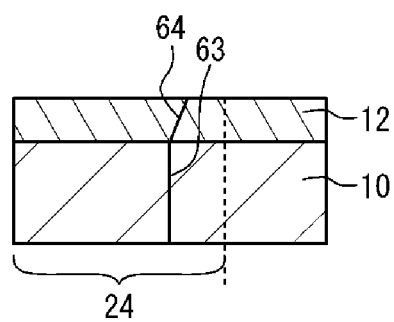
Figure 6C:
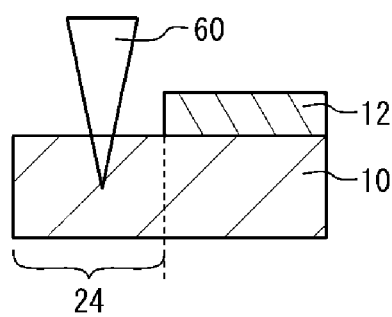
FIG. 6C and FIG. 6D illustrate cross sectional view of a first embodiment.
Figure 6D:
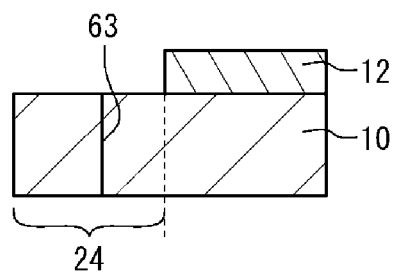

FIG. 6A and FIG. 6B illustrate cross sectional views of the first comparative example. FIG. 6C and FIG. 6D illustrate cross sectional views of the first embodiment. As illustrated in FIG. 6A, in the first comparative example, when the support substrate 10 is cut, a laser light 60 is radiated to the support substrate 10 of the area 24. Thus, an alteration layer is formed in the support substrate 10. In this case, a radiation condition of the laser light 60 may be complicated because of a difference between refractive indices of the piezoelectric substrate 12 and the support substrate 10. As illustrated in FIG. 6B, when the support substrate 10 is cut by braking, a substantially vertical cracking 63 may occur in the support substrate 10. However, an inclined cracking 64 may occur in the piezoelectric substrate 12.

As illustrated in FIG. 6C, in the first embodiment, the piezoelectric substrate 12 of the area 24 is removed. Therefore, the radiation condition of the laser light 60 can be simplified. As illustrated in FIG. 6D, when the support substrate 10 is cut by breaking, a substantially vertical cracking 63 may occur in the support substrate 10. An inclined cracking does not occur because the piezoelectric substrate 12 is removed.

When the support substrate 10 is cut by another method and the piezoelectric substrate 12 of the area 24 is remained, the cutting condition may be complicated and/or cracking may occur in the piezoelectric substrate 12. In the first embodiment, the complication of the cutting condition can be suppressed and cracking of the piezoelectric substrate 12 can be suppressed. From this point of view, it is preferable that the piezoelectric substrate 12 of the area 24 is removed.

Figure 7A:
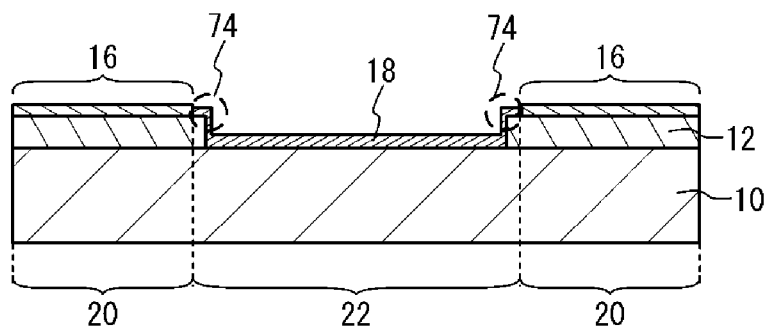
FIG. 7A illustrates a cross sectional view of a second comparative example.
Figure 7B:
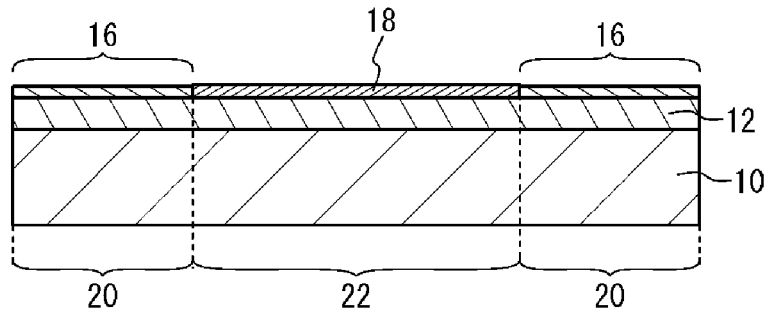
FIG. 7B illustrates a cross sectional view of a first embodiment.

FIG. 7A illustrates a cross sectional view of a second comparative example. FIG. 7B illustrates a cross sectional view of the first embodiment. As illustrated in FIG. 7A, in the second comparative example, the piezoelectric substrate 12 of the area 22 on which the interconnection lines 18 are formed is removed. With the structure, in the area 22, the interconnection lines 18 are formed on the support substrate 10. Therefore, a level difference 74 is formed between the area 20 on which the acoustic wave elements 16 are formed and the area 22 on which the interconnection lines 18 are formed. The interconnection lines 18 locally become thinner on a side face of the level difference 74. In this case, a problem of reliability such as disconnection of the interconnection lines 18 may occur. When the interconnection lines 18 are not formed on the level difference 74, the manufacturing process may be complicated.

As illustrated in FIG. 7B, in the acoustic wave device of the first embodiment, the piezoelectric substrate 12 beneath the interconnection lines 18 is remained. Therefore, a level difference corresponding to the facet of the piezoelectric substrate 12 of the second comparative example does not occur. Accordingly, it is possible to suppress the interconnection lines 18 becoming locally thinner.

As mentioned above, in the first embodiment, the piezoelectric substrate 12 beneath the interconnection lines 18 are remained. Thus, as described in FIG. 7A and FIG. 7B, it is possible to suppress the interconnection lines 18 becoming locally thinner.

The piezoelectric substrate 12 of the area 24 is removed. Thus, as described in FIG. 6A to FIG. 6D, when the support substrate 10 is cut, it is possible to suppress that the cutting condition is complicated and/or cracking occurs in the piezoelectric substrate 12. It is preferable that the whole of the piezoelectric substrate 12 of the area 24 is removed. However, a part or all of the piezoelectric substrate 12 of the area 24 may be remained.

Moreover, the piezoelectric substrate 12 of at least a part of the area 26 other than the acoustic wave elements 16, the interconnection lines 18 and the area 24 is removed. Thus, as described in FIG. 5A and FIG. 5B, it is possible to suppress the loss of the acoustic wave elements 16. It is preferable that the piezoelectric substrate 12 outside of the acoustic wave elements 16 in the propagation direction of the surface acoustic wave 50 is removed from a viewpoint of suppression of the loss of the acoustic wave elements 16. And, it is possible to suppress the accumulation of the stress at the interface 56 and the accumulation of the electrical charge at the interface 56 caused by pyroelectricity. From this point of view, it is preferable that the area of the remained piezoelectric substrate 12 is small. It is therefore preferable that the whole of the piezoelectric substrate 12 of the area 26 is removed.

Second Embodiment

Figure 8A:
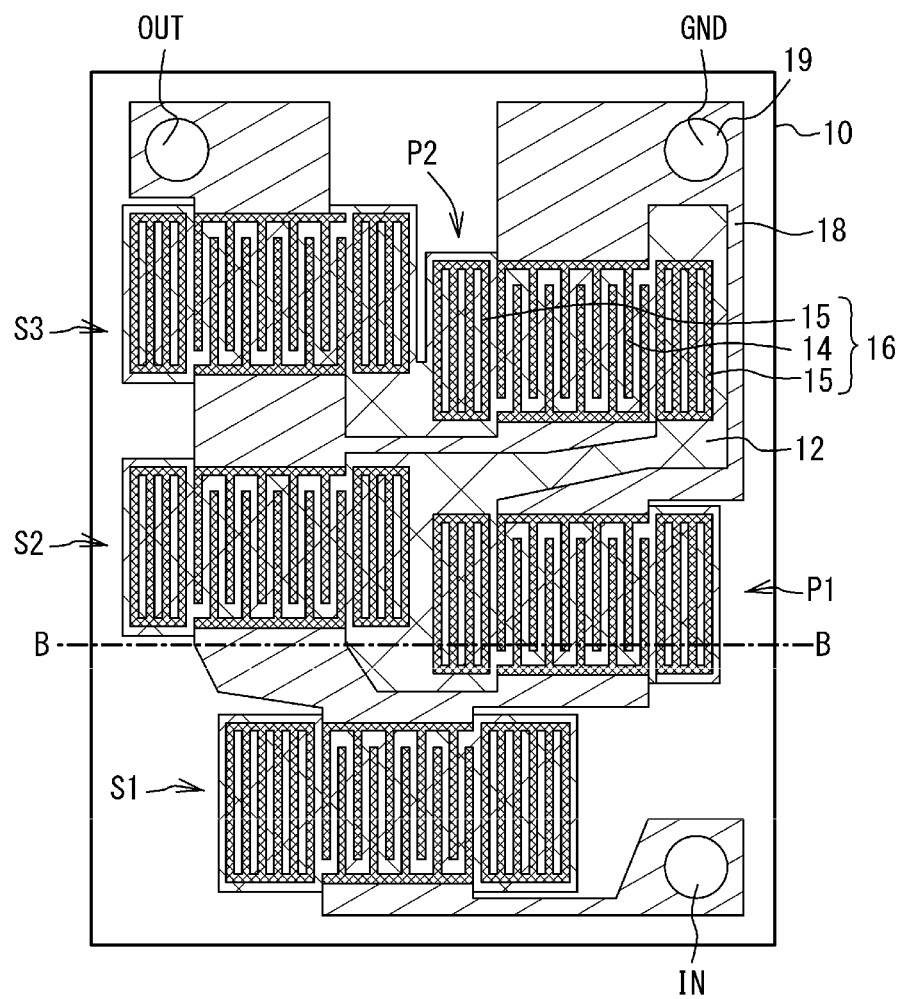
FIG. 8A illustrates a plane view of an acoustic wave device in accordance with a second embodiment.
Figure 8B:
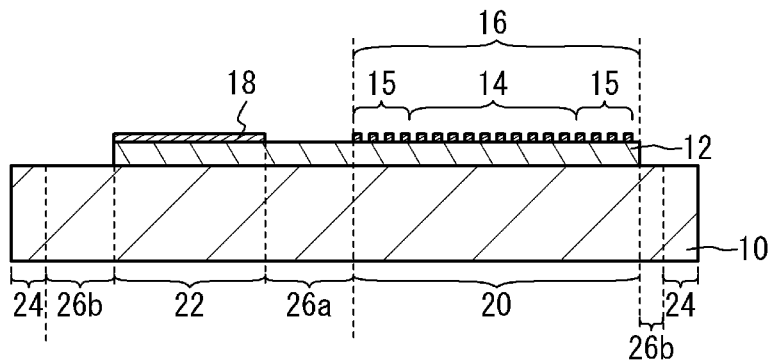
FIG. 8B illustrates a cross sectional view take along a line B-B of FIG. 8A.

FIG. 8A illustrates a plane view of an acoustic wave device in accordance with a second embodiment. FIG. 8B illustrates a cross sectional view take along a line B-B of FIG. 8A. As illustrated in FIG. 8A and FIG. 8B, the piezoelectric substrate 12 of the area 20 on which the acoustic wave elements 16 are formed and the piezoelectric substrate 12 of the area 22 on which the interconnection lines 18 are formed is remained. The piezoelectric substrate 12 of the area 24 is removed. The piezoelectric substrate 12 of an area 26a surrounded by the acoustic wave elements 16 and the interconnection lines 18 in the area 26 other than the acoustic wave elements 16, the interconnection lines 18 and the area 24 is remained. The piezoelectric substrate 12 of an area 26b of the area 26 outside of the acoustic wave elements 16 and the interconnection lines 18 is removed. Other structures are the same as the first embodiment. Therefore, an explanation of the structures is omitted.

Figure 9A:
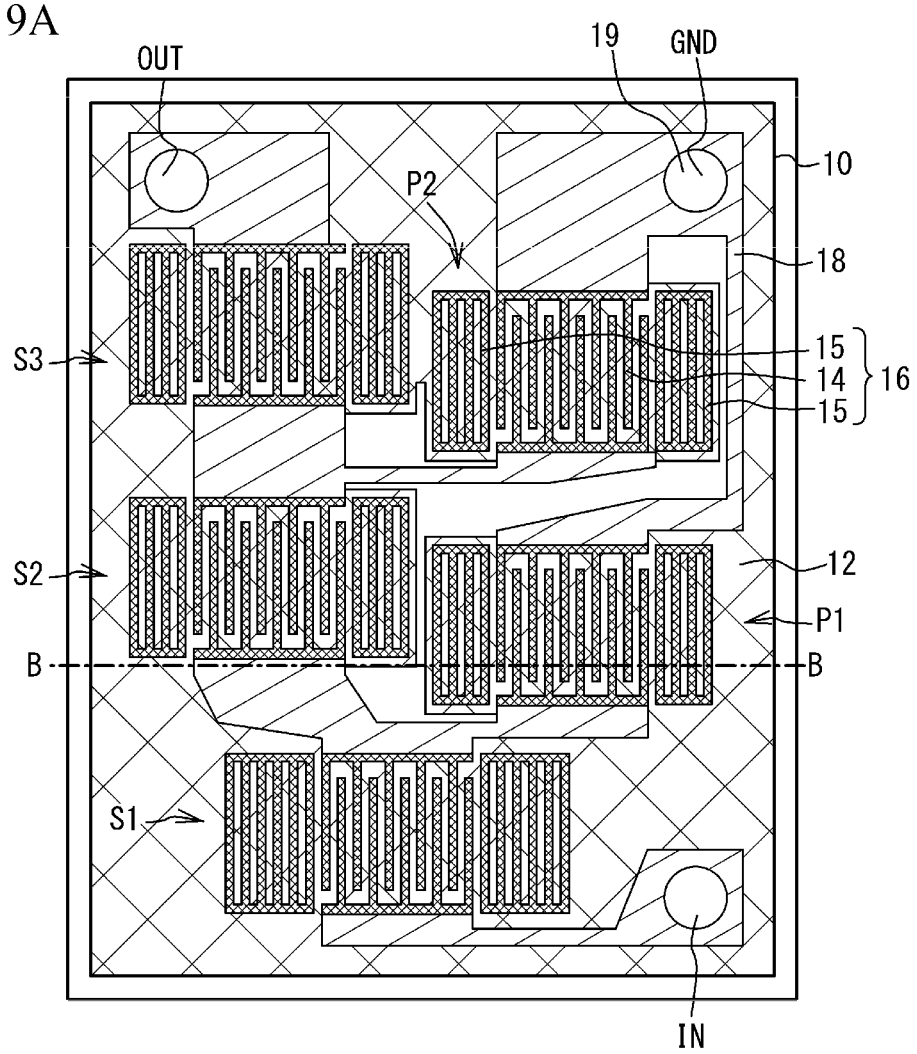
FIG. 9A illustrates a plane view of an acoustic wave device in accordance with a first modification of a second embodiment.
Figure 9B:
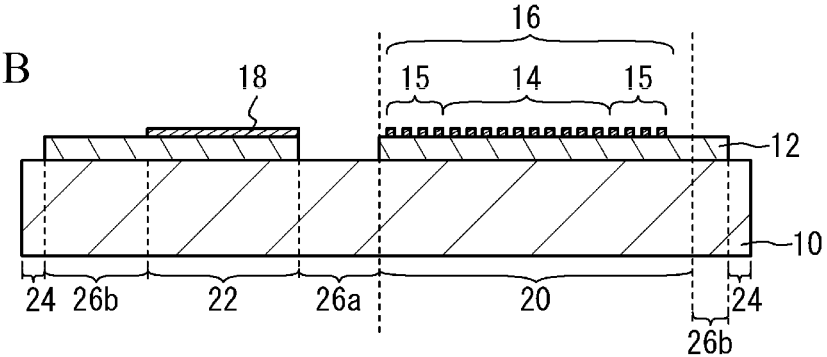
FIG. 9B illustrates a cross sectional view taken along a line B-B of FIG. 9A.

FIG. 9A illustrates a plane view of an acoustic wave device in accordance with a first modification of the second embodiment. FIG. 9B illustrates a cross sectional view taken along a line B-B of FIG. 9A. As illustrated in FIG. 9A and FIG. 9B, the piezoelectric substrate 12 of the area 26a of the area 26 surrounded by the acoustic wave elements 16 and the interconnection lines 18 is removed. The piezoelectric substrate 12 of the area 26b outside of the acoustic wave elements 16 and the interconnection lines 18 is remained. Other structures are the same as the second embodiment. Therefore, an explanation of the structures is omitted.

Figure 10A:
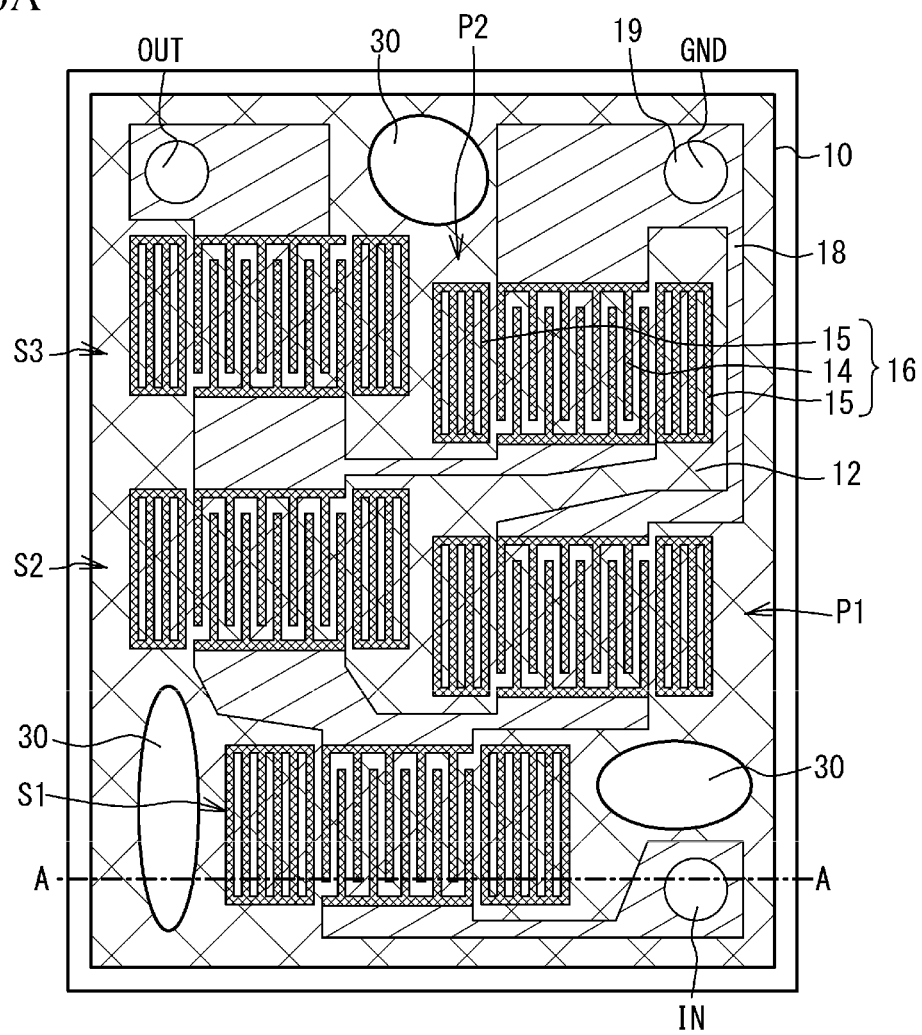
FIG. 10A illustrates a plane view of an acoustic wave device in accordance with a second modification of a second embodiment.
Figure 10B:
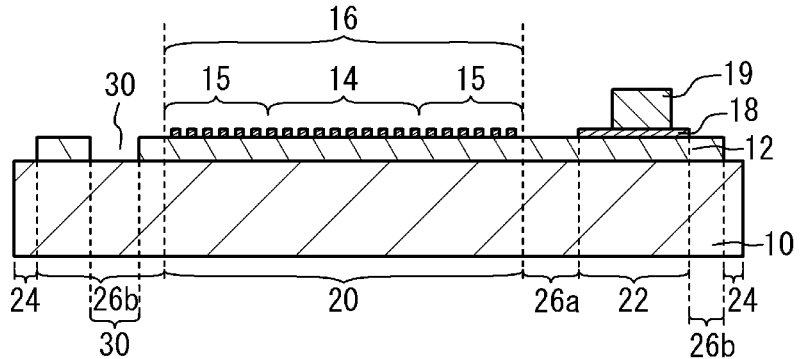
FIG. 10B illustrates a cross sectional view taken along a line B-B of FIG. 10A.

FIG. 10A illustrates a plane view of an acoustic wave device in accordance with a second modification of the second embodiment. FIG. 10B illustrates a cross sectional view taken along a line A-A of FIG. 10A. As illustrated in FIG. 10A and FIG. 10B, the piezoelectric substrate 12 of an area 30 that is a part of the area 26b outside of the acoustic wave elements 16 and the interconnection lines 18 is removed. The piezoelectric substrate 12 of the other area of the area 26 is remained. Other structures are the same as the second embodiment. Therefore, an explanation of the structures is omitted.

The piezoelectric substrate 12 of at least a part (fifth area) of the area 26 other than the area 20 on which the acoustic wave elements 16 are formed, the area 22 on which the interconnection lines 18 are formed and the area 24 is removed, as in the case of the second embodiment and the modification. With the structure, the area of the remained piezoelectric substrate 12 is reduced. And, it is possible to suppress the loss of the acoustic wave elements 16, the accumulation of the stress to the interface 56 and the accumulation of the electrical charge to the interface 56.

As in the case of the second embodiment, the piezoelectric substrate 12 of the area 26a of the area 26 surrounded by the acoustic wave elements 16 and interconnection lines 28 may be remained, and the piezoelectric substrate 12 of the area 26b of the area 26 outside of the acoustic wave elements 16 and the interconnection lines 18 may be removed. When the piezoelectric substrate 12 is remained so as to surround outside of the area 26, the stress and the electrical charge accumulated to the interface 56 are enlarged. In the second embodiment, the piezoelectric substrate 12 of the area 26b surrounding the acoustic wave elements 16 is removed. With the structure, the accumulation of the stress and the accumulation of the electrical charge can be suppressed.

As in the case of the first modification of the second embodiment, the piezoelectric substrate 12 of the area 26a of the area 26 surrounded by the acoustic wave elements 16 and the interconnection lines 28 may be removed, and the piezoelectric substrate 12 of the area 26b outside of the acoustic wave elements 16 and the interconnection lines 28 may be remained. The area 26a is closer to the interconnection lines 18 (for example, a ground interconnection line and a signal interconnection line) having a different potential. With the structure, the piezoelectric substrate 12 between the interconnection lines 18 that are adjacent to each other and have a different potential is removed. It is therefore possible to suppress an electrostatic capacitance between the interconnection lines 18 having an influence on the characteristics.

The piezoelectric substrate 12 of the area 30 that is a part of the area 26b outside of the acoustic wave elements 16 and the interconnection lines 28 may be removed as in the case of the second modification of the second embodiment. The piezoelectric substrate 12 of the area that is a part of the area 26a surrounded by the acoustic wave elements 16 and the interconnection lines 28 may be removed.

As mentioned above, it is preferable that the piezoelectric substrate 12 between the interconnection lines 18 having a different potential is removed. With the structure, it is possible to suppress the electrostatic capacitance between the interconnection lines 18.

Third Embodiment

FIG. 11A illustrates a cross sectional view of the first embodiment. FIG. 11B to FIG. 11E illustrate cross sectional views of the third embodiment and modifications of the third embodiment. As illustrated in FIG. 11A, in the first embodiment, the surface acoustic wave 50 excited by the acoustic wave element 16 propagates near the surface of the piezoelectric substrate 12, is reflected by the facet 11 of the piezoelectric substrate 12, and becomes the surface acoustic wave 52 propagating into the acoustic wave element 16. Thus, the loss of the acoustic wave element 16 is suppressed. On the other hand, in the acoustic wave element 16, a bulk wave that is an unnecessary acoustic wave 54 is excited. The acoustic wave 54 propagates in a bulk of the piezoelectric substrate 12, is reflected by the facet 11, and returns to the acoustic wave element 16. The acoustic wave 54 is a factor of spurious.

As illustrated in FIG. 11B, in the third embodiment, convexo-concave is formed on the facet 11 that is positioned in the propagation direction of the surface acoustic wave 50. A pitch and a height of the convexo-concave are irregular. The acoustic wave 54 is diffusely reflected by the facet 11. Therefore, the spurious caused by the acoustic wave 54 is suppressed.

As illustrated in FIG. 11C, in the first modification of the third embodiment, convexo-concave of a lower part 11b of the facet 11 is larger than that of an upper part 11a of the facet 11. For example, the upper part 11a has a substantially mirror surface. With the structure, the surface acoustic wave 50 propagating near the surface of the piezoelectric substrate 12 is reflected by the upper part 11a. Therefore, the loss of the acoustic wave element 16 can be suppressed. The acoustic wave 54 propagating in the piezoelectric substrate 12 is diffusely reflected by the lower part 11b. Thus, the spurious caused by the acoustic wave 54 can be suppressed.

As illustrated in FIG. 11D, in the second modification of the third embodiment, the angle θ between the facet 11 and the upper face of the support substrate 10 is an acute angle. For example, the facet 11 has a substantially mirror surface. With the structure, the acoustic wave 54 repeats reflections between the facet 11 and the upper face of the support substrate 10, and goes toward the edge of the piezoelectric substrate 12. Therefore, the acoustic wave 54 does not return to the acoustic wave element 16. Thus, the spurious caused by the acoustic wave 54 can be suppressed. The facet 11 may have convexo-concave.

As illustrated in FIG. 11E, in the third modification of the third embodiment, an angle θ between the lower part 11b of the facet 11 and the upper face of the support substrate 10 is smaller than that between the upper part 11a and the upper face of the support substrate 10. For example, the upper part 11a and the lower part 11b have a mirror surface. The upper part 11a is substantially vertical to the upper face of the support substrate 10. With the structure, the surface acoustic wave 50 propagating near the surface of the piezoelectric substrate 12 is reflected by the upper part 11a and becomes the surface acoustic wave 52. It is therefore possible to suppress the loss of the acoustic wave element 16. The acoustic wave 54 does not return to the acoustic wave element 16 as in the case of the second modification of the third embodiment. Thus, the spurious caused by the acoustic wave 54 can be suppressed. The upper part 11a may have convexo-concave.

The convexo-concave and the angle θ of the facet can be arbitrarily determined by optimizing the condition of the etching or the blast process for removing the piezoelectric substrate 12.

Fourth Embodiment

Figure 12A:
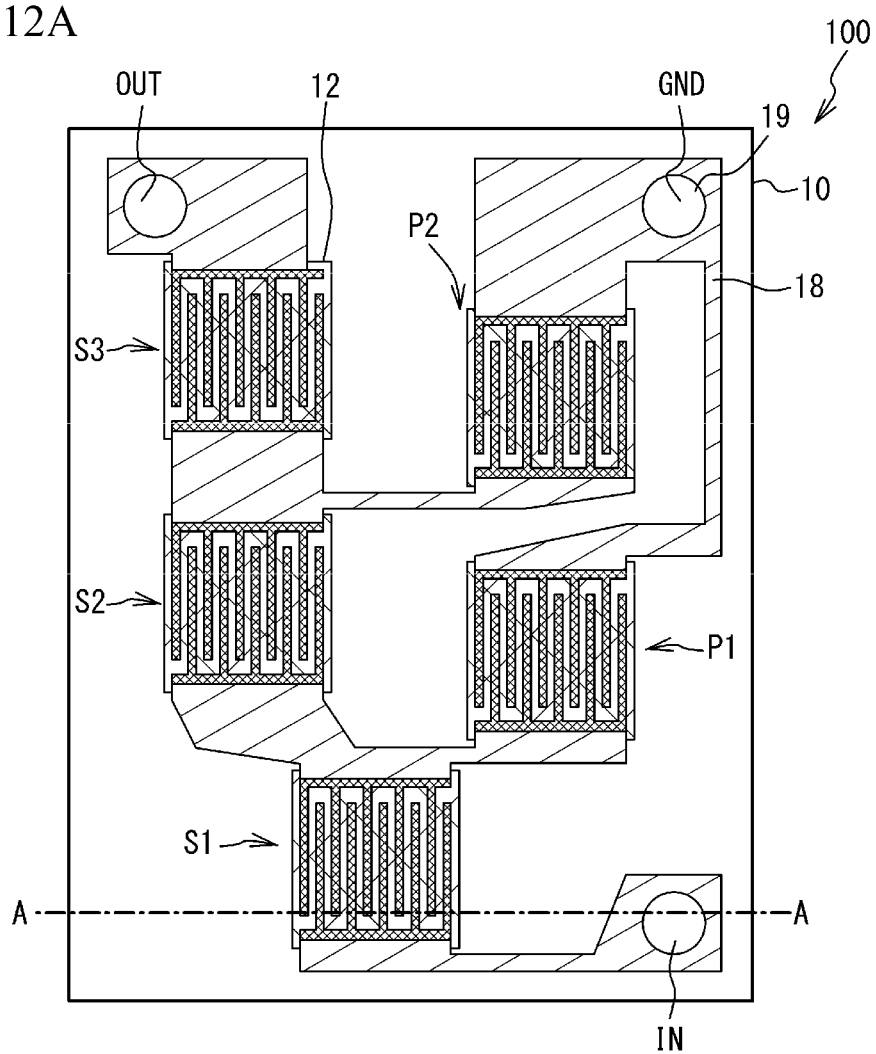
FIG. 12A illustrates a plane view of an acoustic wave device in accordance with a fourth embodiment.
Figure 12B:
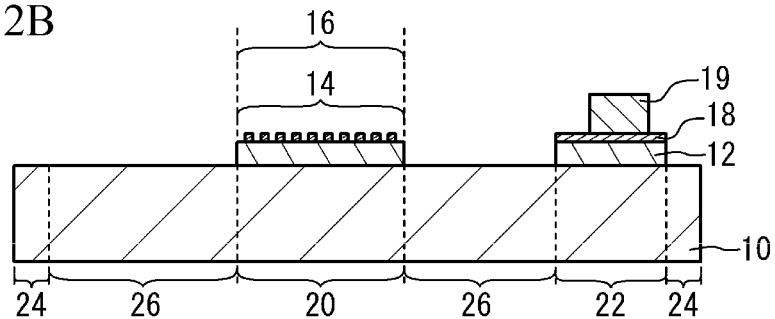
FIG. 12B illustrates a cross sectional view taken along a line A-A of FIG. 12A.

FIG. 12A illustrates a plane view of an acoustic wave device in accordance with a fourth embodiment. FIG. 12B illustrates a cross sectional view taken along a line A-A of FIG. 12A. As illustrated in FIG. 12A and FIG. 12B, in the acoustic wave device 100, the acoustic wave elements 16 do not have the reflectors 15. In this manner, in the propagation direction of the acoustic wave excited by the IDT 14, the piezoelectric substrate 12 is removed. When the facet 11 of the piezoelectric substrate 12 is formed, the facet reflects the acoustic wave. Therefore, the acoustic wave device may lack of the reflectors 15. Other structures are the same as FIG. 1A and FIG. 1B of the first embodiment. Therefore, an explanation of the structures is omitted.

The acoustic wave devices are described as the first to fourth embodiments and the modifications. However, the first to fourth embodiments and the modifications may be an interface acoustic wave device or a love wave device.

The present invention is not limited to the specifically described embodiments, but other embodiments and variations may be made without departing from the scope of the claimed invention.

What is claimed is:

1. An acoustic wave device comprising:
   a support substrate that is a single substrate;
   a piezoelectric substrate that is jointed on the support substrate;
   a plurality of acoustic wave resonators that are provided on the piezoelectric substrate; and
   an interconnection line that is provided on the piezoelectric substrate and couples the plurality of acoustic wave resonators,
   wherein:
   the piezoelectric substrate of a first area is jointed on the support substrate in the first area, and the first area is defined as an area where the plurality of acoustic wave resonators are provided;
   the piezoelectric substrate of a second area is jointed on the support substrate in the second area, and the second area is defined as an area where the interconnection line is provided;
   a third area of the acoustic wave device is defined along sides of the support substrate; and
   a fourth area of the acoustic wave device that is defined as an area other than the first area, the second area and the third area has a fifth area in which the piezoelectric substrate is absent on the support substrate, the fifth area being an enclosed opening in the piezoelectric substrate a circumference of which is completely surrounded by inner edges of the piezoelectric substrate.

2. The acoustic wave device as claimed in claim 1, wherein in the third area of the acoustic wave device, the piezoelectric substrate is absent on the support substrate.

3. The acoustic wave device as claimed in claim 1, wherein:
   in an enclosed area of the acoustic wave device that is surrounded only by the plurality of acoustic wave resonators and the interconnection line, the piezoelectric substrate is disposed and is jointed on the support substrate,
   said fifth area is located outside of the plurality of acoustic wave resonators and the interconnection line.

4. The acoustic wave device as claimed in claim 1, wherein:
   said fifth area is surrounded only by the plurality of acoustic wave resonators and the interconnection line, and
   the fourth area has a sixth area in which the piezoelectric substrate is disposed and is jointed on the support substrate, the sixth area being located outside of the fifth area, the plurality of acoustic wave resonators and the interconnection line.

5. The acoustic wave device as claimed in claim 1, wherein in a part of the fourth area between interconnection lines, of which potentials are different from each other, the piezoelectric substrate is absent on the support substrate.

6. The acoustic wave device as claimed in claim 1, wherein a plurality of convex parts and a plurality concave parts are formed on a facet of the piezoelectric substrate that is positioned in a propagation direction of acoustic waves excited by the plurality of acoustic wave resonators.

7. The acoustic wave device as claimed in claim 1, wherein:
   a plurality of convex parts and a plurality concave parts are formed on a lower part and an upper part of a facet of the piezoelectric substrate that is positioned in a propagation direction of acoustic waves excited by the plurality of acoustic wave resonators; and
   the plurality of convex parts and the plurality concave parts of the lower part is larger than those of the upper part.

8. The acoustic wave device as claimed in claim 1, wherein an angle between a facet of the piezoelectric substrate that is positioned in a propagation direction of acoustic waves excited by the plurality of acoustic wave resonators and an upper face of the support substrate is an acute angle.

9. The acoustic wave device as claimed in claim 1, wherein:
   an angle between an upper face of the support substrate and a lower part of a facet of the piezoelectric substrate that is positioned in a propagation direction of acoustic waves excited by the plurality of acoustic wave resonators is smaller than that between the upper face and an upper part of the facet.

10. The acoustic wave device as claimed in claim 1, wherein the piezoelectric substrate is a lithium tantalate substrate or a lithium niobate substrate.

11. An acoustic wave device comprising:
    a support substrate that is a single substrate;
    a piezoelectric substrate that is jointed on the support substrate;
    a plurality of acoustic wave resonators that are provided on the piezoelectric substrate; and
    an interconnection line that is provided on the piezoelectric substrate and couples the plurality of acoustic wave resonators,
    wherein:
    the piezoelectric substrate of a first area is jointed on the support substrate in the first area, and the first area is defined as an area where the plurality of acoustic wave resonators are provided;
    the piezoelectric substrate of a second area is jointed on the support substrate in the second area, and the second area is defined as an area where the interconnection line is provided; and
    in at least part of a third area of the acoustic wave device, which is defined as an enclosed area surrounded only by the plurality of acoustic wave resonators and the interconnection line, the piezoelectric substrate is absent on the support substrate.

12. The acoustic wave device according to claim 11, wherein:
    in a fourth area of the acoustic wave device, which is provided outside the plurality of acoustic wave resonators and the interconnection line, the piezoelectric substrate is disposed and is jointed on the support substrate.

13. The acoustic wave device as claimed in claim 11, wherein in an entire area of the third area, the piezoelectric substrate is absent on the support substrate.

14. An acoustic wave device comprising:
    a support substrate that is a single substrate;
    a piezoelectric substrate that is jointed on the support substrate;
    a plurality of acoustic wave resonators that are provided on the piezoelectric substrate; and
    an interconnection line that is provided on the piezoelectric substrate and couples the plurality of acoustic wave resonators,
    wherein:

the piezoelectric substrate of a first area is jointed on the support substrate in the first area, and the first area is defined as an area where the plurality of acoustic wave resonators are provided;

the piezoelectric substrate of a second area is jointed on the support substrate in the second area, and the second area is defined as an area where the interconnection line is provided; and in all of areas of the acoustic wave device other than the first area and the second area, the piezoelectric substrate is absent on the support substrate.

* * * * *